United States Patent
Anderson et al.

(10) Patent No.: US 7,087,470 B2
(45) Date of Patent: Aug. 8, 2006

(54) DUAL GATE DIELECTRIC THICKNESS DEVICES

(75) Inventors: Brent A. Anderson, Jericho, VT (US); Terence B. Hook, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/873,012

(22) Filed: Jun. 21, 2004

(65) Prior Publication Data

US 2005/0280097 A1 Dec. 22, 2005

(51) Int. Cl.
*H01L 29/72* (2006.01)
(52) U.S. Cl. .................. 438/157; 438/197; 257/371
(58) Field of Classification Search ............... 438/157, 438/758, 197; 257/371
See application file for complete search history.

(56) References Cited

U.S. PATENT DOCUMENTS

| | | | |
|---|---|---|---|
| 6,191,049 B1 * | 2/2001 | Song | 438/758 |
| 6,248,618 B1 | 6/2001 | Quek et al. | |
| 6,602,751 B1 | 8/2003 | Oohashi | |
| 6,653,192 B1 | 11/2003 | Ryoo | |
| 6,716,685 B1 * | 4/2004 | Lahaug | 438/157 |
| 2001/0031523 A1 | 10/2001 | Kimizuka | |

* cited by examiner

*Primary Examiner*—Edward Wojciechowicz
(74) *Attorney, Agent, or Firm*—Schmeiser, Olsen & Watts; William D. Sabo

(57) ABSTRACT

A semiconductor device and a method of fabricating the semiconductor device, the semiconductor device including: one or more FETs of a first polarity and one or more FETs of a second and opposite polarity, at least one of the one or more FETs of the first polarity having a gate dielectric having a thickness different from a thickness of a gate dielectric of at least one of the one or more FETs of the second polarity.

23 Claims, 12 Drawing Sheets

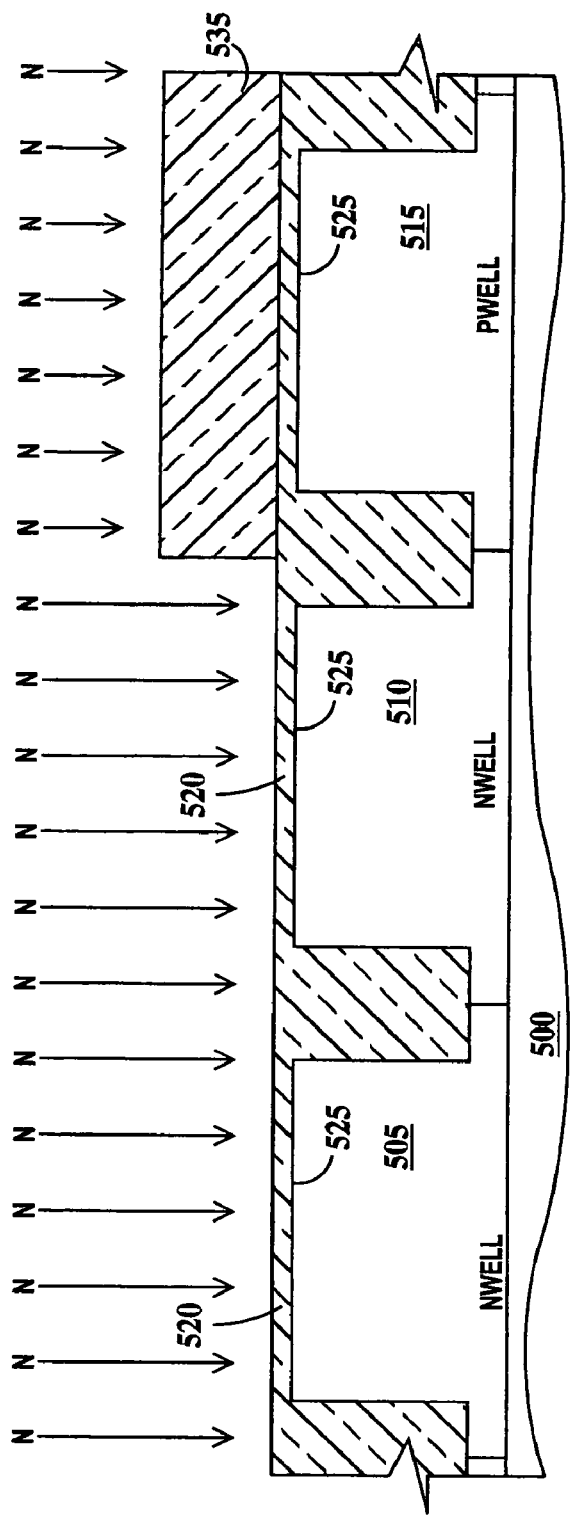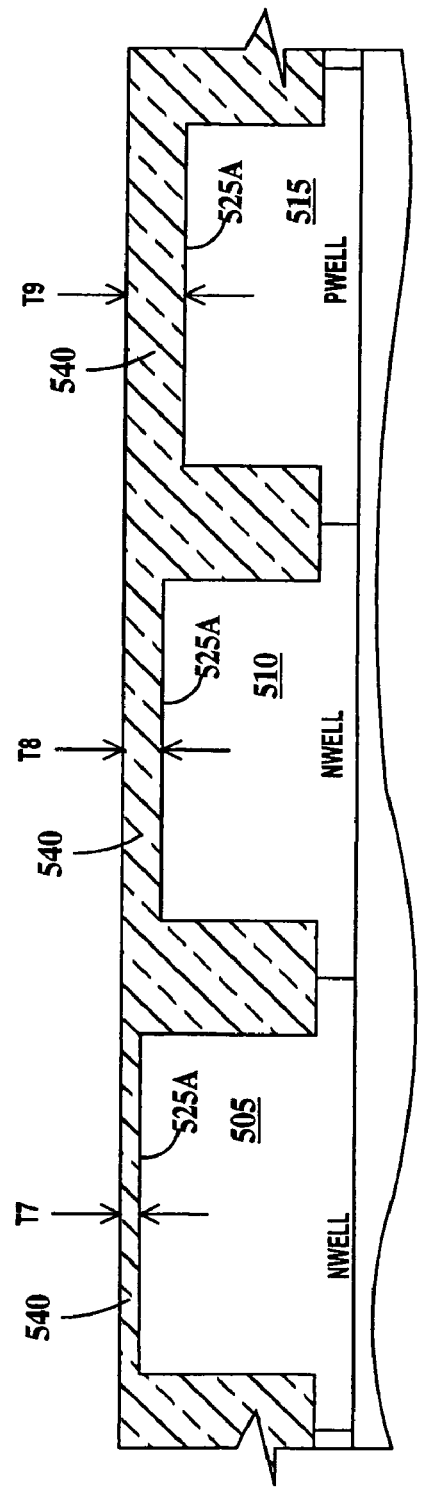
FIG. 12C
FIG. 12D

DUAL GATE DIELECTRIC THICKNESS DEVICES

FIELD OF THE INVENTION

The present invention relates to the field of Complementary Metal Oxide Silicon (CMOS) devices; more specifically, it relates to CMOS devices having tailored gate leakage characteristics, a method of fabricating CMOS devices having tailored gate leakage characteristics and circuits utilizing fabricating CMOS devices having tailored gate leakage characteristics.

BACKGROUND OF THE INVENTION

Modern integrated circuits are subject to both performance and power usage specifications. For battery operated devices power consumption becomes a critical parameter and performance is often reduced in order to obtain increased battery life. Therefore, there is a need for integrated circuits that have higher performance without significantly increasing power consumption.

SUMMARY OF THE INVENTION

A first aspect of the present invention is a semiconductor device, comprising: one or more FETs of a first polarity and one or more FETs of a second and opposite polarity, at least one of the one or more FETs of the first polarity having a gate dielectric having a thickness different from a thickness of a gate dielectric of at least one of the one or more FETs of the second polarity.

A second aspect of the present invention is a semiconductor device, comprising: one or more PFETs and one or more NFETs, at least one of the one or more PFETs having a gate dielectric having a thickness different from a thickness of a gate dielectric of at least one of the one or more NFETs.

A third aspect of the present invention is an inverter circuit, comprising: a PFET and an NFET, a source of the PFET connected to VDD and a source of the NFET connected to ground, gates of the NFET and PFET connected to an input and drains of the PFET and NFET connected to an output, the PFET having a gate dielectric having a thickness different from a thickness of a gate dielectric of the NFET.

A fourth aspect of the present invention is a method of fabricating semiconductor devices, comprising: (a) providing an N-well and a P-well in a substrate; (b) ion implanting either the N-well, the P-well or both the N-well and the P-well; and (c) simultaneously growing a first thermal gate oxide layer at a first rate on a surface of the substrate over the P-well and growing a second thermal gate oxide layer at a second rate on the surface of the substrate over the N-well, the first rate different than the second rate.

A fifth aspect of the present invention is a method of fabricating an inverter, comprising: (a) providing an N-well and a P-well in a substrate; (b) ion implanting the N-well with nitrogen; (c) simultaneously growing a first thermal gate oxide layer at a first rate on the surface of the substrate over the P-well and growing a second thermal gate oxide layer at a second rate on the surface of the substrate over the N-well, the first rate different than the second rate (d) forming a first gate on a top surface of the first thermal gate oxide layer and forming a second gate on a top surface of the second thermal gate oxide layer; (e) forming an N doped source and an N doped drain on opposite sides of the first gate in the P-well; (f) forming a P doped source and a P doped drain on opposite sides of the second gate in the N-well; and (g) coupling the P doped source to VDD, coupling the N doped source to ground, coupling the N doped and P doped drains to an output and coupling the first and second gates to an input.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 12A through 12D are partial cross-sectional views illustrating how multiple different gate oxide thickness regions can be fabricated according to a third embodiment of the present invention.

DETAILED DESCRIPTION OF THE INVENTION

Gate dielectric tunneling leakage is defined as the flow of current between a field effect transistor (FET)s gate, substrate/body and source/drains when the gate, body and source/drains are at different voltage levels. For the purposes of the present invention, the term FET is equivalent to the term metal-oxide-silicon FET or MOSFET, though in modern MOSFETs, the gate is often polysilicon and not a true metal. Gate oxide is a type of gate dielectric.

Transistor switching speed is directly proportional to the current delivered by the transistor and inversely proportional to the capacitance that this current must drive. The drive current may be increased by reducing the threshold voltage of the transistor, but this has the undesirable effect of increasing standby power consumption. The drive current may also be increased by reducing the gate dielectric thickness, and provided that the current increases to a degree greater than the load capacitance increases, the circuit performance will improve. If the resultant gate tunneling current does not increase too much, then the power consumption will not increase significantly.

Figure 1:
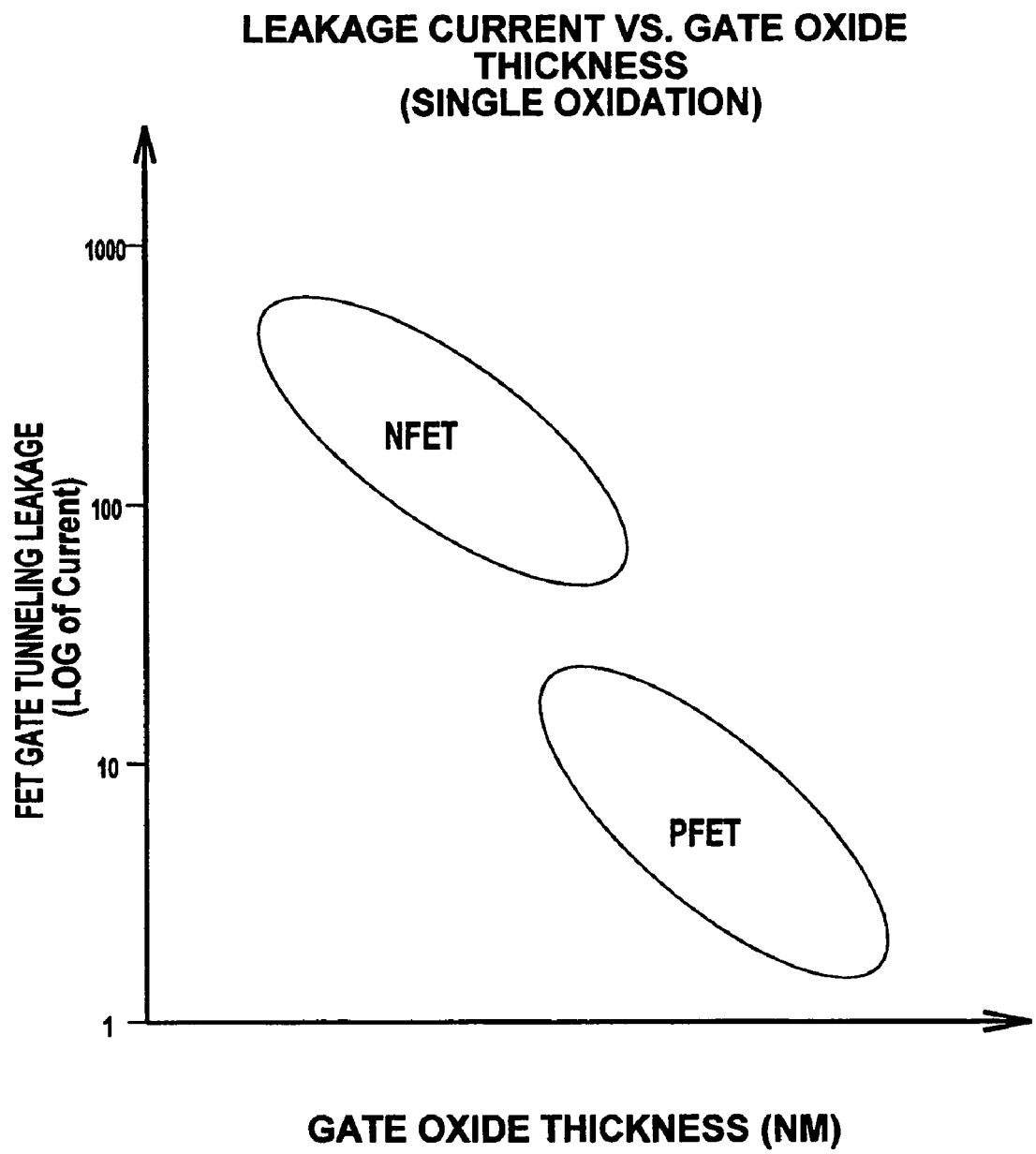
FIG. 1 is plot of FET leakage current versus gate oxide thickness for both NFETs and PFETs when fabricated with a single gate oxidation process.

FIG. 1 is plot of FET leakage current versus gate oxide thickness for both NFETs and PFETs when fabricated with a single gate oxidation process. FIG. 1 was generated by actual measurement of NFETs and PFETs on the same multiple integrated circuit chips. The NFETs and PFETs measured were fabricated using a single oxidation step to create the gate oxide of both the NFETs and PFETs. In FIG. 1, the FET gate tunneling leakage is plotted on a logarithmic scale and the gate oxide thickness is plotted on a linear scale. In general, FIG. 1 illustrates that lowest NFET gate tunneling leakage is approximately 10 times greater then highest PFET gate tunneling leakage when the gate oxide thicknesses of the PFET and NFET are the same. Thus overall CMOS circuit gate tunneling leakage will be dominated by the gate tunneling leakage of the NFETs during circuit operation. The gate tunneling leakage of NFETs is greater than the gate tunneling leakage of PFETs because the electron tunneling barrier is higher in PFETs than NFETs. When the gate dielectric is a high dielectric constant (high-k) material such as rare earth oxides such as $Hf_xSi_yO_z$, the opposite may occur.

Gate tunneling leakage should not be confused with sub-threshold voltage leakage. Sub-threshold voltage leakage is the flow of current from the drain to the source of an FET and when the gate and the source of the FET are at the same voltage, which will occur when the FET is off and is due to the barrier height presented to the majority carrier. This type of leakage can be controlled by N and P type dopant species ion implants into the channel region that control the dopant profile of channel region. Sub-threshold voltage leakage is not directly affected by gate oxide thickness.

Figure 2A:
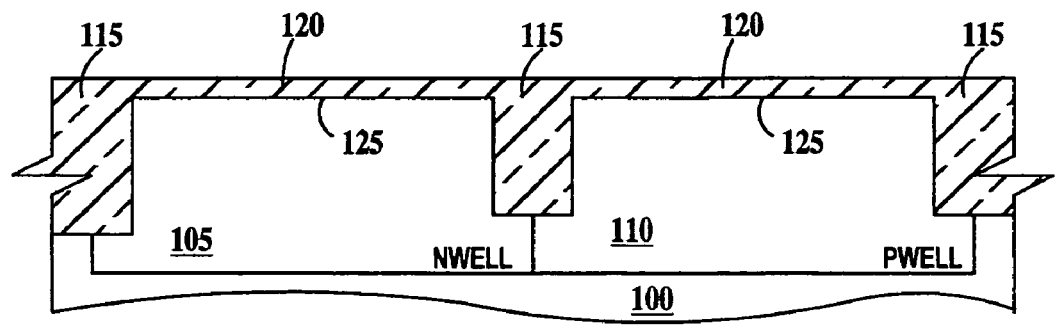
FIGS. 2A through 2D are partial cross-sectional views illustrating fabrication of an NFET and a PFET according to a first embodiment of the present invention.

FIGS. 2A through 2D are partial cross-sectional views illustrating fabrication of an NFET and a PFET according to a first embodiment of the present invention. In FIG. 2A, a silicon substrate 100 (or the silicon layer formed on a silicon-on-insulator substrate) includes an N-well 105 and a P-well 110. N-well 105 and P-well 110 are partially isolated from each other by trench isolation (TI) 115. TI 115 may be shallow trench isolation (STI) or deep trench isolation (DTI). A screen oxide layer 120 has been formed on a top surface 125 of substrate 100. In one example screen oxide is about 50 Å to about 100 Å thick. TI 115, may be replaced by other isolation schemes well known in the art.

Figure 2B:
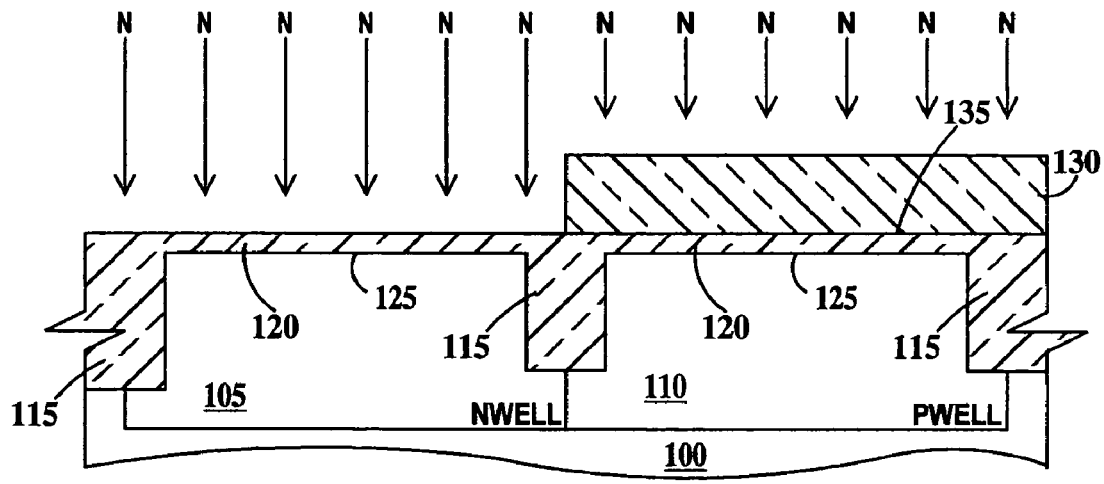

In FIG. 2B, a masking layer 130 has been formed on a top surface 135 of screen oxide layer 120 over P-well 110 and a nitrogen ion implantation performed of sufficient energy to penetrate into N-well 105 but not into P-well 110 through masking layer 130. In one example the nitrogen ion implantation is about 1 $E^{13}$ atoms/cm$^2$ to about 3 $E^{14}$ atoms/cm$^2$ at about 30 Kev to about 50 Kev.

Figure 2C:
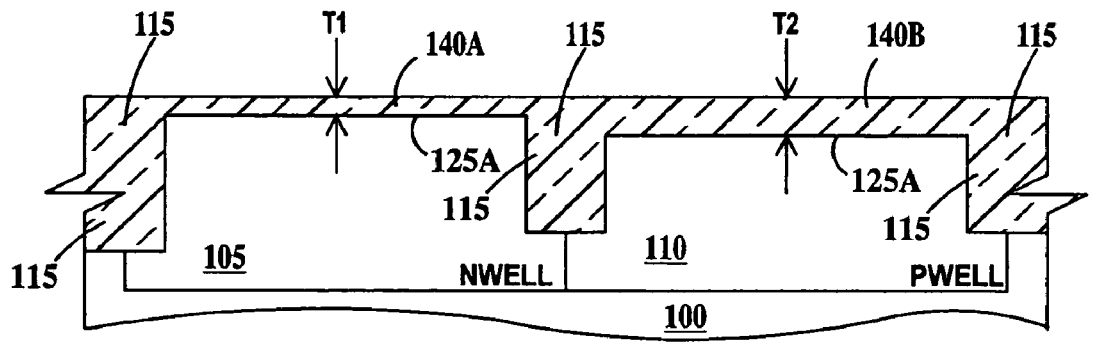

In FIG. 2C, screen oxide layer 120 has been removed and a gate oxide layer 140A grown on top surface 125A of substrate 100 over N-well 105 and a gate oxide layer 140B grown over P-well 110 on top surface 125A of substrate 100. Gate oxide layer 140A and gate oxide layer 140B are grown simultaneously. Gate oxide layers 140A and 140B may be grown by wet or dry thermal oxidation using $H_2O$ or $O_2$ respectively, rapid thermal oxidation using $O_2$ (RTO) or rapid thermal oxidation using NO gas (RTNO). Growing an oxide entails a chemical reaction of the silicon of the substrate with an oxygen containing species resulting in formation of a silicon oxide layer and consumption of silicon on the surface of the substrate. Gate oxide layer 140A has a physical thickness of T1 and gate oxide layer 140B has a physical thickness of T2 where T2 is greater than T1. The nitrogen implantation into N-well 105 has retarded gate oxide growth over N-well 105. In one example T1 is about 5 Å to about 25 Å and T2 is about 5.1 Å to about 30 Å. The difference in thickness T1 and T2 depends on the total oxide thickness growth as illustrated in TABLE I:

TABLE I

| Thickness (T1) of gate oxide layer 140A | Thickness (T2) of gate oxide layer 140B |
|---|---|
| about 18 Å | about 20 Å |
| about 20 Å | about 23 Å |
| about 24 Å | about 28 Å |

Figure 2D:
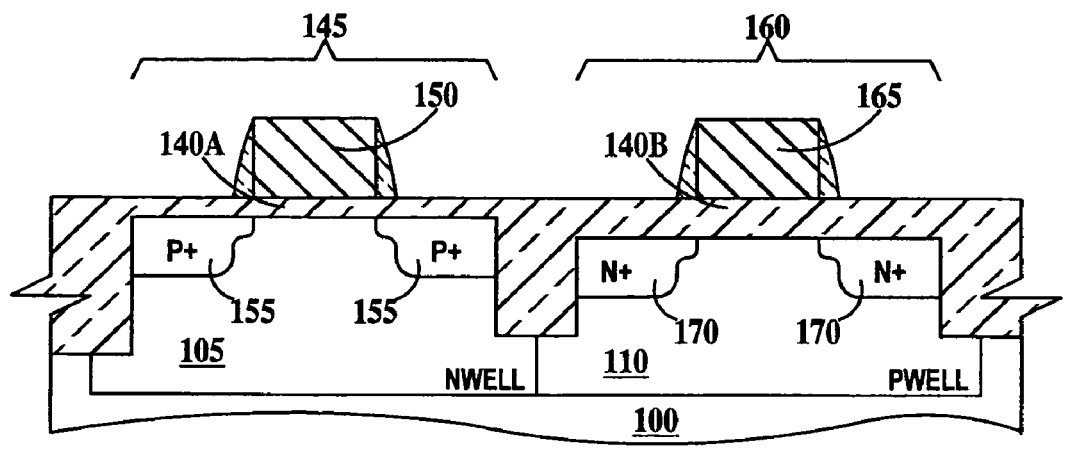

In FIG. 2D, a PFET 145 including a gate 150 over gate oxide layer 140A and source/drains 155 in N-well 105 is formed using methods well known in the art. An NFET 160 including a gate 165 over gate oxide layer 140B and source/drains 170 in P-well 110 is formed using methods well known in the art. PFET 145, having a gate oxide thickness of T1 has a higher performance (faster switching speed) than a PFET having a gate oxide thickness of T2. PFET 145 also has more tunneling gate leakage current than a PFET having the same gate dielectric thickness as NFET 160. The nitrogen ion implantation of FIG. 2B can be used to tune gate tunneling leakage of PFET 145 to be equal to or a fraction less than one of the gate tunneling leakage of NFET 160.

Figure 3A:
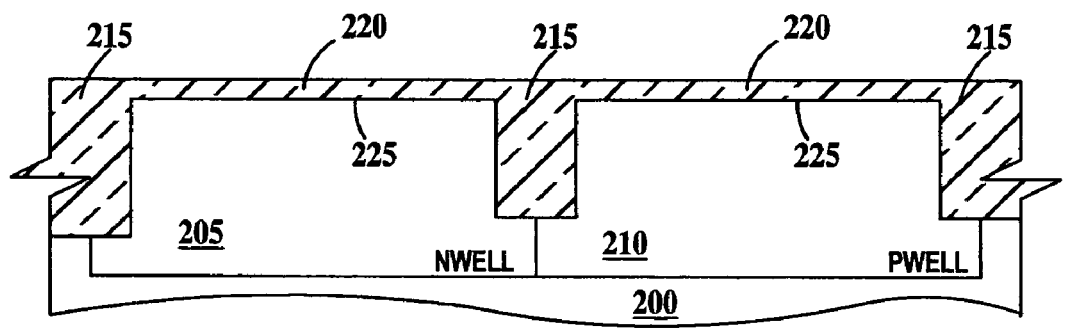
FIGS. 3A through 3D are partial cross-sectional views illustrating fabrication of an NFET and a PFET according to a second embodiment of the present invention FIG. 4 a partial cross-sectional view illustrating the first and second embodiments of the present invention applied to FETS of opposite polarity from those illustrated in FIGS. 2D and 3D.

FIGS. 3A through 3D are partial cross-sectional views illustrating fabrication of an NFET and a PFET according to a second embodiment of the present invention. In FIG. 3A, a silicon substrate 200 (or the silicon layer formed on a silicon-on-insulator substrate) includes an N-well 205 and a P-well 210. N-well 205 are partially isolated from each other by TI 215. A screen oxide layer 220 has been formed on a top surface 225 of substrate 200. In one example screen oxide is about 50 Å to about 100 Å thick. TI 215, may be replaced by other isolation schemes well known in the art.

Figure 3B:
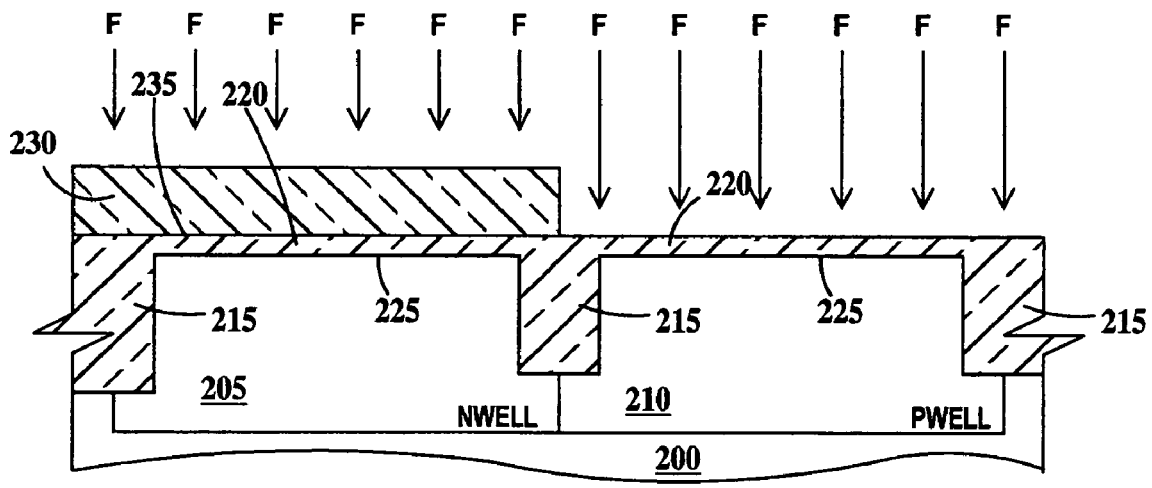

In FIG. 3B, a masking layer 230 has been formed on a top surface 235 of screen oxide 220 over P-well 210 and a fluorine ion implantation performed of sufficient energy to penetrate into P-well 210 but not into N-well 205 through masking layer 230. In one example the fluorine ion implantation is about 1 $E^{13}$ atoms/cm$^2$ to about 3 $E^{14}$ atoms/cm$^2$ at about 30 Kev to about 50 Kev.

Figure 3C:
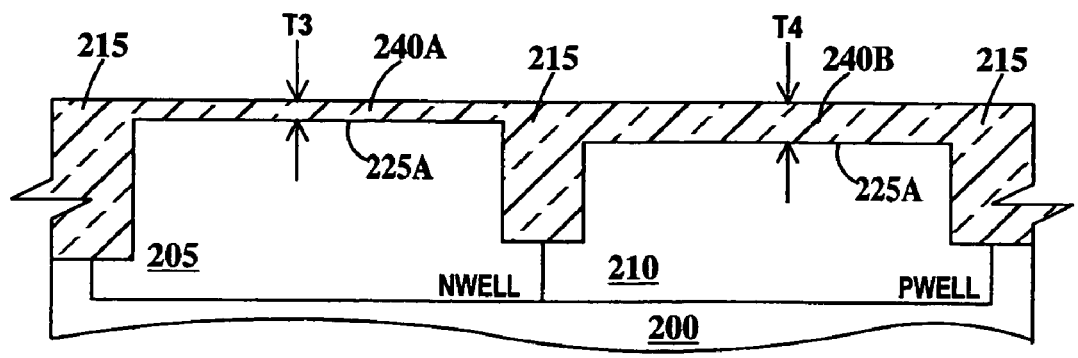

In FIG. 3C screen oxide 220 has been removed and a gate oxide layer 240A grown on top surface 225A of substrate 200 over N-well 205 and a gate oxide layer 240B grown over P-well 210 on top surface 225A of substrate 200. Gate oxide layer 240A and gate oxide layer 240B are grown simultaneously. Gate oxide layers 240A and 240B may be formed by wet or dry thermal oxidation using $H_2O$ or $O_2$ respectively, rapid thermal oxidation using $O_2$ or rapid thermal oxidation using NO gas. Gate oxide layer 240A has a physical thickness of T3 and gate oxide layer 240B has a physical thickness of T4 where T4 is greater than T3. The fluorine implantation into N-well 210 has enhanced gate oxide growth over N-well 210. In one example T3 is about 5 Å to about 25 Å and T4 is about 5.1 Å to about 30 Å. The difference in thickness T3 and T4 depends on the total oxide thickness growth as illustrated in TABLE II:

TABLE II

| Thickness (T3) of gate oxide layer 240A | Thickness (T4) of gate oxide layer 240B |
| --- | --- |
| about 18 Å | about 20 Å |
| about 20 Å | about 23 Å |
| about 24 Å | about 28 Å |

Figure 3D:
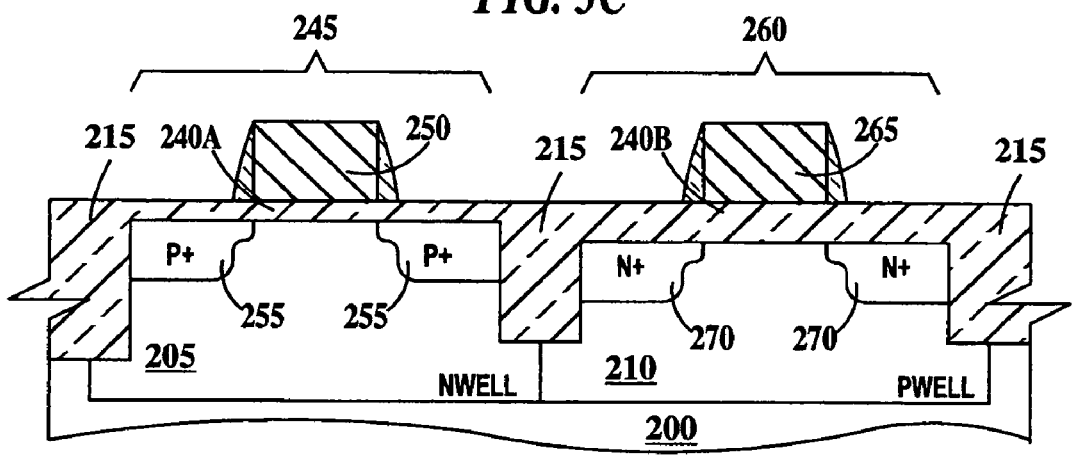

In FIG. 3D, a PFET 245 including a gate 250 over gate oxide layer 240A and source/drains 255 in N-well 205 is formed using methods well known in the art. An NFET 260 including a gate 265 over gate oxide layer 240B and source/drains 270 in P-well 210 is formed using methods well known in the art. The fluorine ion implantation of FIG. 3B can be used to tune the gate tunneling leakage of NFET 260 to be equal to or less than the gate tunneling leakage of PFET 245.

Figure 4:
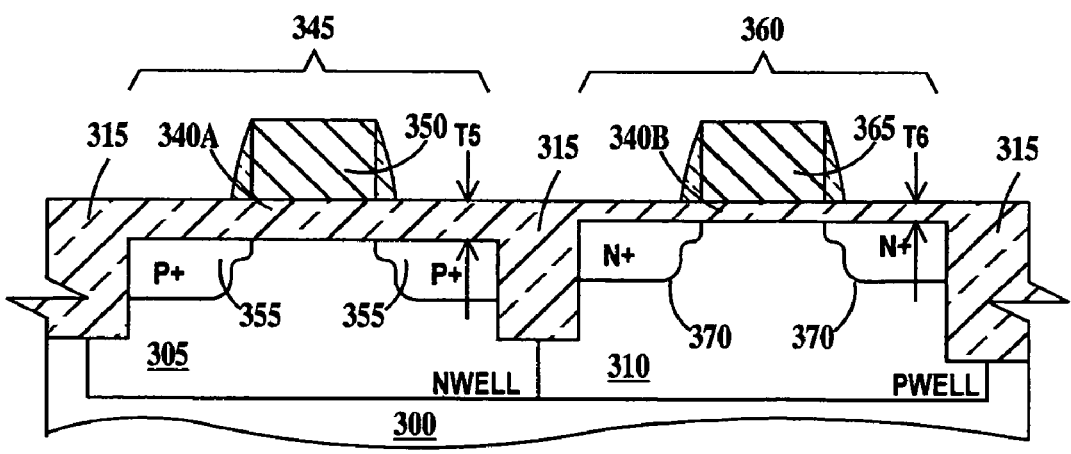

Though not illustrated in FIGS. 2D, 3D and 4, an additional layer of gate dielectric may be formed over the gate oxide dielectric. Such additional layers could be silicon nitride or high k materials such rare earth oxides such as $HfSi_xO_y$.

The plots presented hereafter are based on nitrogen ion implantation of the N-wells of PFETs with the NFET gate dielectric thickness defining a nominal gate oxide thickness of the gate oxidation process. Similar results may be expected by fluorine implantation of the P-wells of NFETs.

FIG. 4 a partial cross-sectional view illustrating the first and second embodiments of the present invention applied to FETS of opposite polarity from those illustrated in FIGS. 2D and 3D. In FIGS. 2D and 3D, the thickness of the PFET gate oxide was less than the thickness of the NFET gate oxide. FIG. 4 illustrates that the gate oxide of the NFET can be made thicker than the gate oxide of the PFET. In FIG. 4, PFET 345 has a gate oxide layer 340A having a physical thickness T5 and NFET 360 has a gate oxide layer 340B having a physical thickness T6, where T6 is greater than T5. T6 is made greater than T5 by implanting nitrogen into P-well 310 or implanting fluorine into Nwell 305.

Figure 5:
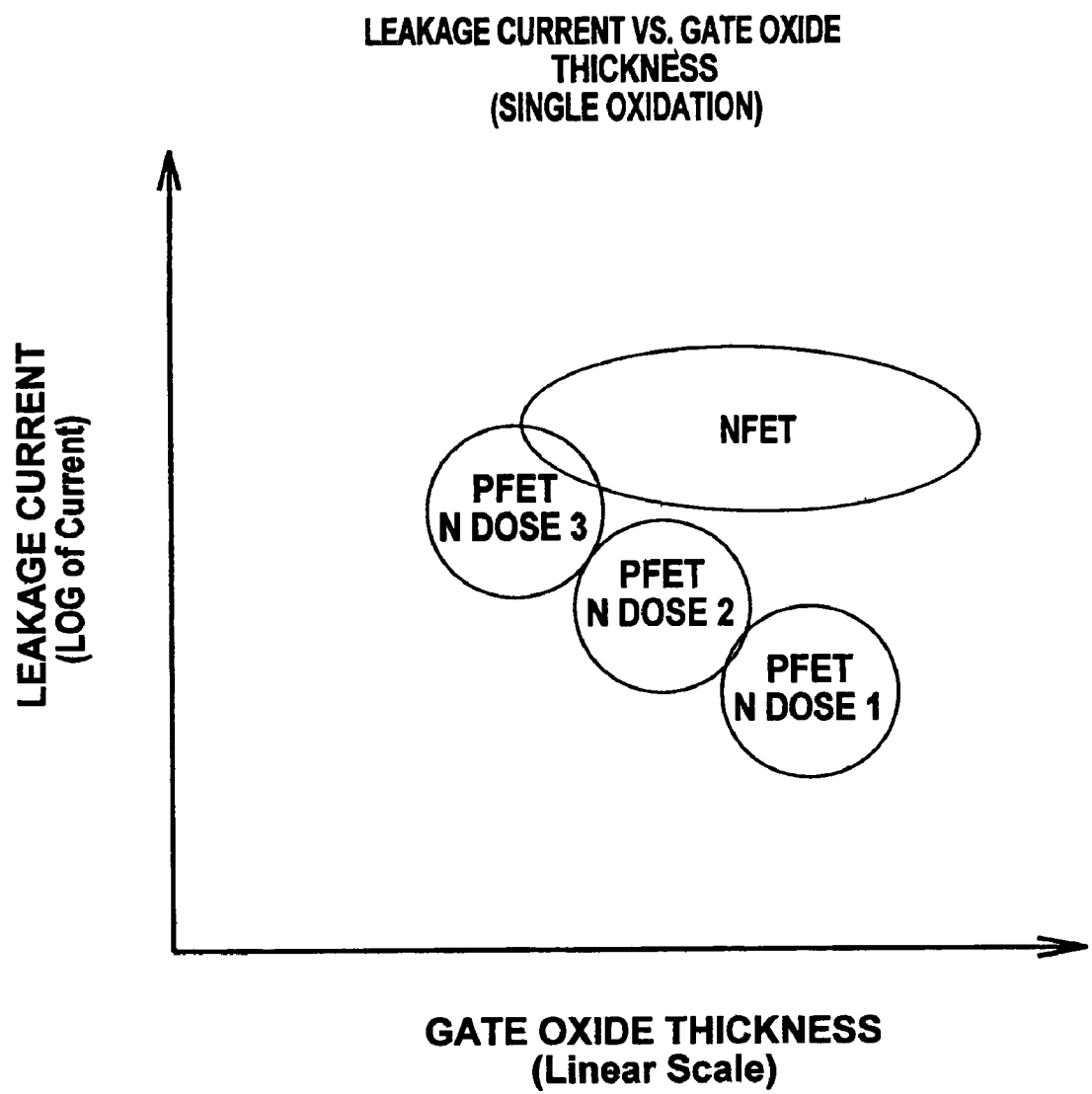
FIG. 5 is a plot of leakage current versus gate oxide thickness for as a function of nitrogen ion implantation dose according to the present invention.

FIG. 5 is a plot of leakage current versus gate oxide thickness for as a function of nitrogen ion implantation dose according to the present invention. FIG. 5 was generated by actual measurement of NFETs and PFETs on the same multiple integrated circuit chips. The NFETs and PFETs measured were fabricated using three different doses of nitrogen ion implantation into the N-wells of the PFETs but not the P-wells of the NFETs and using a single oxidation step to create the gate oxide of both the PFETs and NFETs simultaneously. Dose 3 is higher than dose 2 and dose 2 is higher than dose 1. In FIG. 5, the leakage current is plotted on a logarithmic scale and the gate oxide thickness is plotted on a linear scale. FIG. 5 illustrates that the PFET gate oxide thickness and leakage current can be significantly affected by nitrogen ion implantation dose.

Figure 6:
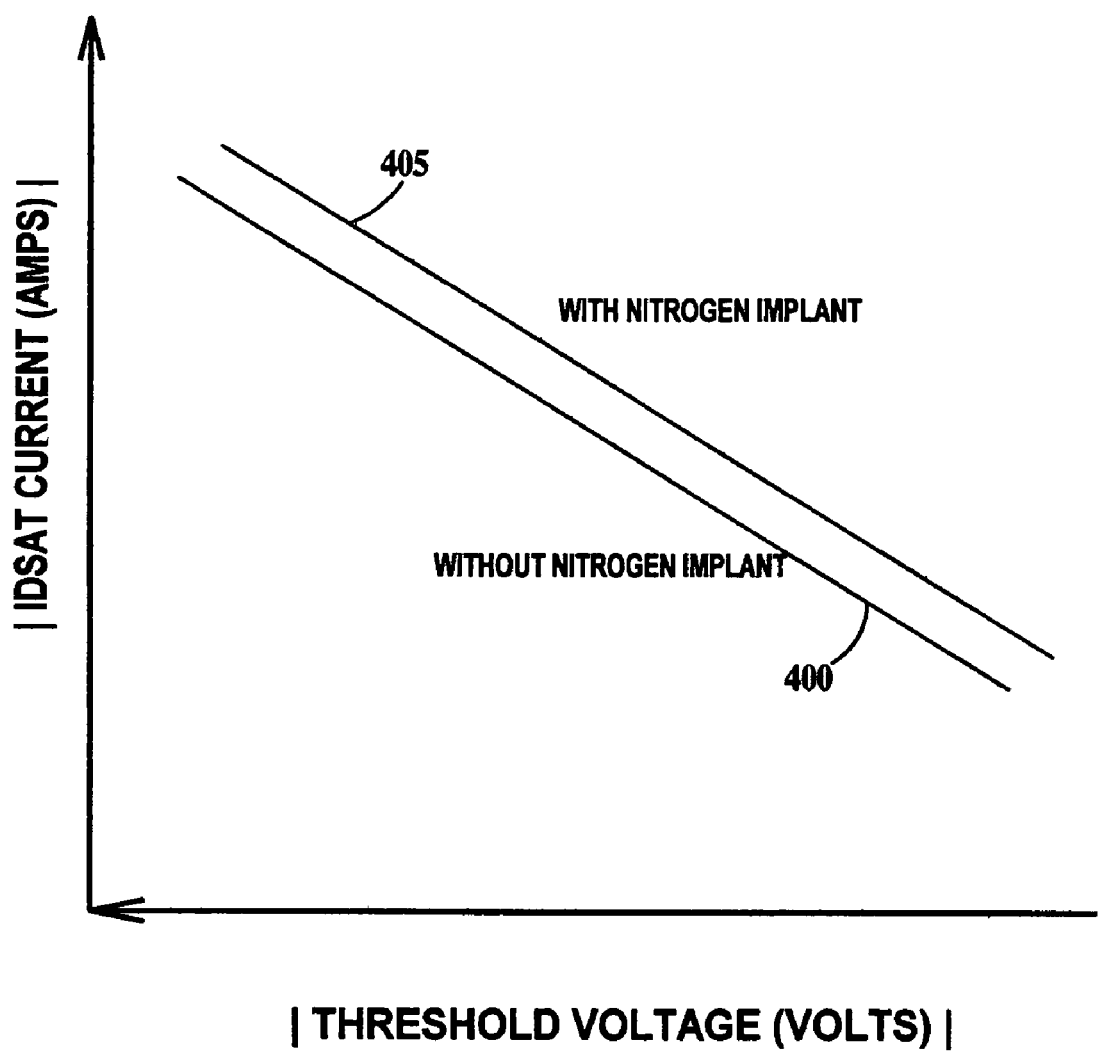
FIG. 6 is a plot of drain current versus threshold voltage for a PFET with and without a nitrogen ion implantation prior to gate oxide formation according to the present invention.
Figure 7:
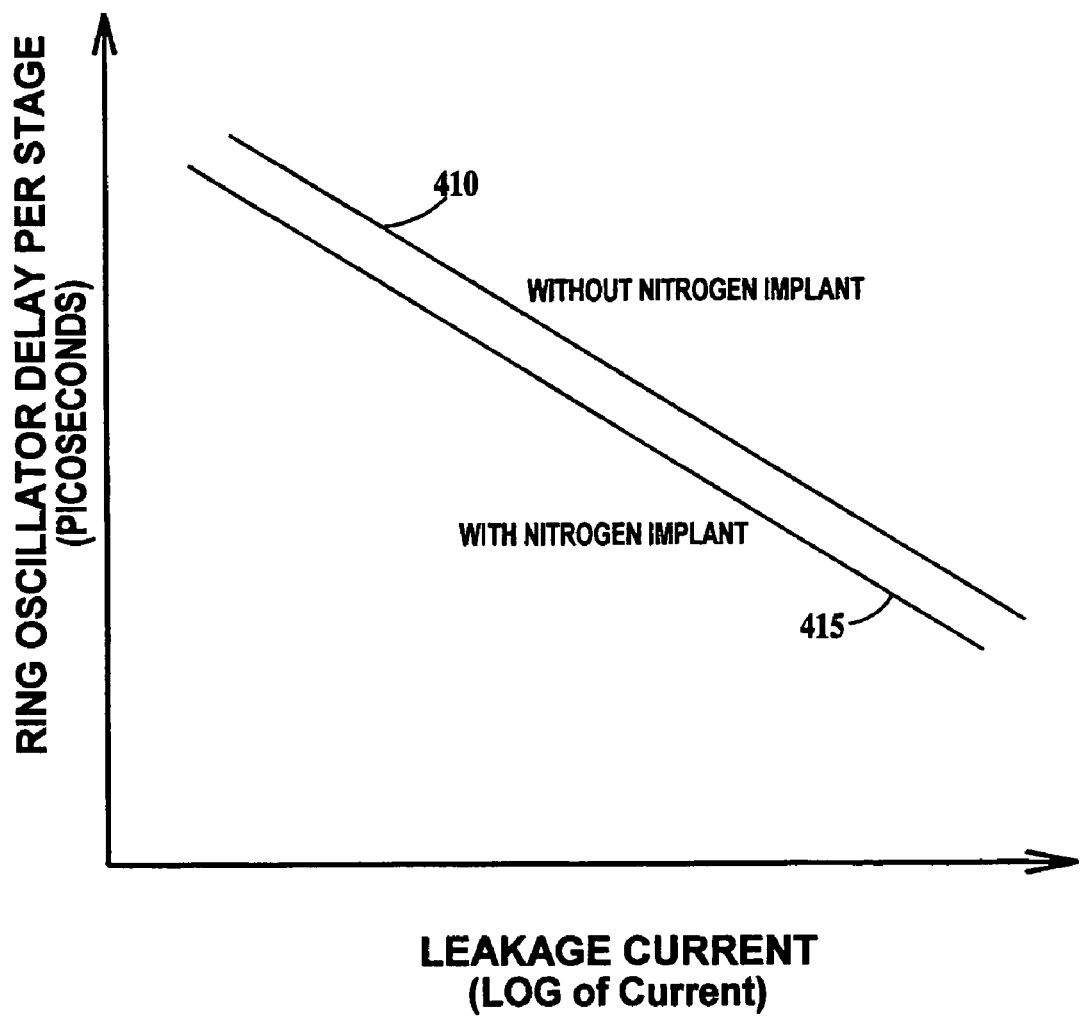
FIG. 7 is a plot of ring oscillator delay versus PFET gate tunneling leakage current with and without a nitrogen ion implantation of the PFET N-well prior to gate oxide formation according to the present invention.

FIG. 6 is a plot of drain current versus threshold voltage for a PFET with and without a nitrogen ion implantation prior to gate oxide formation according to the present invention. FIG. 6 was generated by actual measurement of PFETs on the same multiple integrated circuit chips. A portion of the PFETs measured were fabricated using a nitrogen ion implantation into the N-wells of the PFETs and a portion of the PFETs were fabricated without any nitrogen ion implantation. A single oxidation step was used to create the gate oxide of both the N-well implanted PFETs and non-implanted PFETs simultaneously. Both the PFET saturation current ($I_{DSAT}$) and the threshold voltage are plotted on linear scales. Line 400 is a plot of PFETs without a nitrogen ion implantation into their N-wells and line 405 is a plot of PFET with a nitrogen ion implantation into their N-wells. There is about a 7% increase in saturation current for the PFETs having nitrogen implanted N-wells and hence, thinner gate oxide FIG. 7 is a plot of ring oscillator delay versus PFET gate tunneling leakage current with and without a nitrogen ion implantation of the PFET N-well prior to gate oxide formation according to the present invention. FIG. 7 was generated by actual measurement of a ring oscillator circuit (see FIG. 8) on multiple integrated circuit chips. Some ring oscillator circuits had nitrogen ion implanted N-well PFETs and some ring oscillator circuits did not have nitrogen ion implanted N-well PFETs. Both the ring oscillator delay and the PFET gate tunneling current leakage are plotted on linear scales. Line 410 is a plot of ring oscillator circuits using PFETs without nitrogen ion implanted N-wells and line 415 is a plot of ring oscillator circuits using PFETs with nitrogen ion implanted N-wells and hence thinner gate oxide. There is about a 2% increase in ring oscillator performance at the same cureent level realized in the ring oscillators using PFETs with nitrogen ion implanted N-wells.

Figure 8:
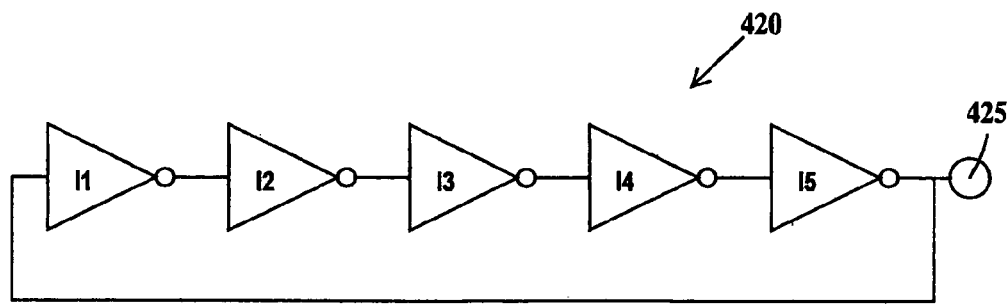
FIG. 8 is a schematic circuit diagram of an exemplary ring oscillator according to the present invention.
Figure 9:
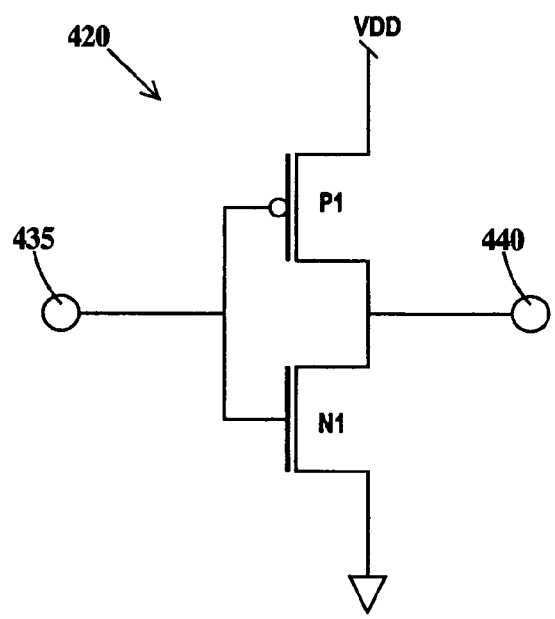
FIG. 9 is a schematic circuit diagram of an exemplary inverter according to the present invention.

FIG. 8 is a schematic circuit diagram of an exemplary ring oscillator 420 according to the present invention. In FIG. 8, ring oscillator 420 includes inverters I1, I2, I3, I4 and I5 connected in series. An inverter is illustrated in FIG. 9 and described infra. The output of inverter I1 is connected to the input of inverter I2, output of inverter I2 is connected to the input of inverter I3, output of inverter I3 is connected to the input of inverter I4, output of inverter I4 is connected to the input of inverter I5, output of inverter I5 is connected to the input of inverter I1 and to output pin 425. Each inverter I1 through I5 is a stage of the ring oscillator. There must be an odd number of stages in a ring oscillator for it to function. Any disturbance, such as noise on output pin 425 will cause signal propagation through the ring of inverters I1 through I5. The frequency of the signal thus generated on output pin 425 is a function of the switching speed of slowest NFET or PFET in any of the inverter I1 through I5. All other FET parameters being equal, the frequency of ring oscillator 420 is a function of the gate oxide thickness of the ring oscillators FETs in general, and of the ring oscillators PFETs in particular.

FIG. 9 is a schematic circuit diagram of an exemplary inverter 430 according to the present invention. In FIG. 9, inverter 430 includes a PFET P1 and an NFET N1. The source of PFET P1 is connected to VDD and the source of NFET N1 is connected to ground. The gates of PFET P1 and NFET N1 are connected to output pin 435 and the drains of PFET P1 and NFET N1 are connected to an input pin 440.

If the gate oxide thickness of PFET P1 and NFET N1 were the same, the performance of inverter 430 (speed of signal propagation from input pin 435 to output pin 440) would be dominated by the switching speed of PFET P1 and the tunneling gate leakage of inverter 430 would be limited by the gate tunneling leakage of NFET N1. By making PFET P1 a thin gate PFET (having thinner gate oxide than NFET N1) the leakage of PFET P1 will be increased, but so will the switching speed of PFET P1 and hence the performance of inverter 430. Under certain circumstances, the increase in inverter performance is more significant than the increase in total gate tunneling leakage (that of PFET P1 and NFET N1 combined).

In a first example, the gate oxide thickness of PFET P1 has been adjusted by one of the methods described supra, such the gate tunneling leakage of PFET P1 is less than about ten times the gate tunneling leakage of NFET N1. In a second example, the gate oxide thickness of PFET P1 has been adjusted by one of the methods described supra, such the gate tunneling leakage of PFET P1 is less than about three times the gate tunneling leakage of NFET N1. In a third example, the gate oxide thickness of PFET P1 has been adjusted by one of the methods described supra, such the gate tunneling leakage of PFET P1 is about equal to the gate tunneling leakage of NFET N1. The N-wells of the PFETs have been implanted with nitrogen as described supra, so the gate dielectric thickness of the PFETs is less than that of the NFET.

Figure 10:
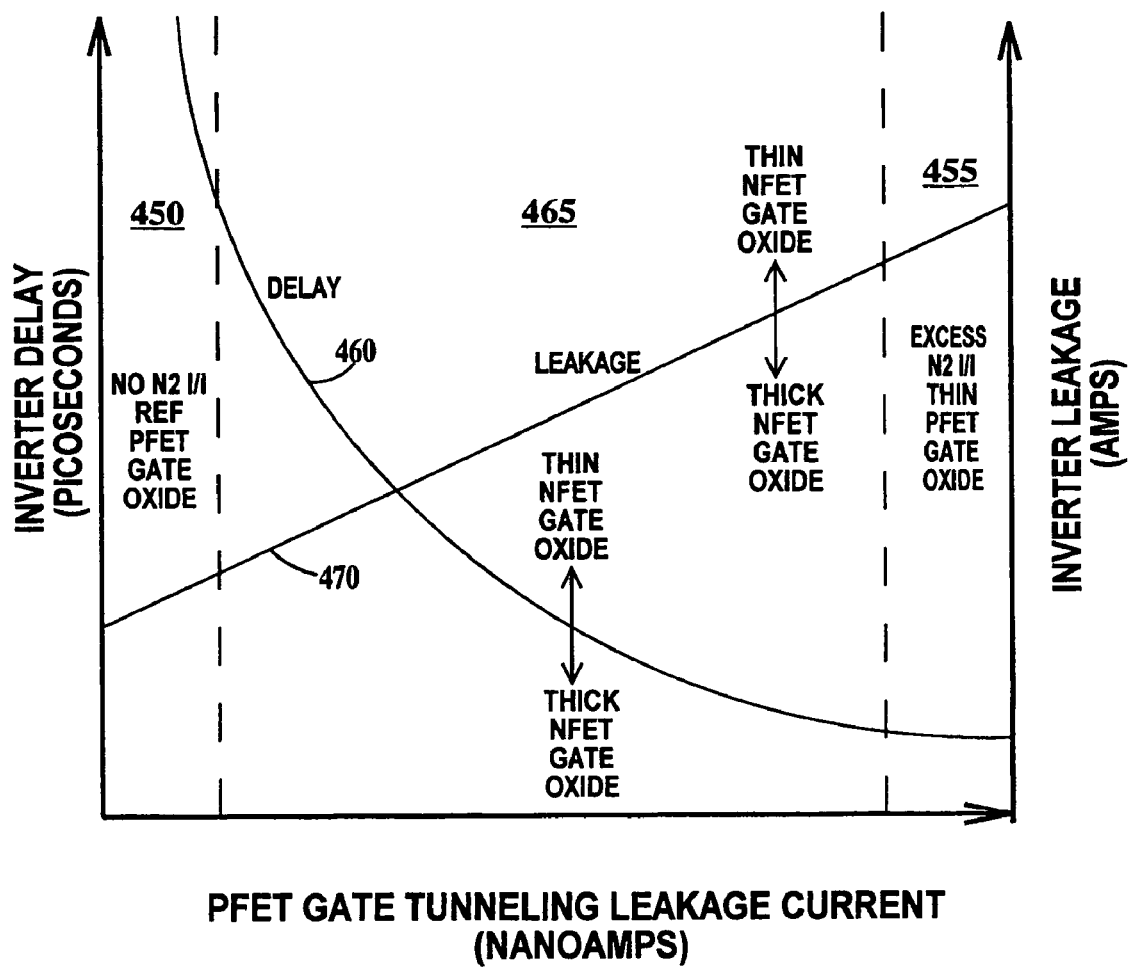
FIG. 10 is a dual plot of inverter delay and inverter leakage versus PFET gate tunneling leakage current with a nitrogen ion implantation of the PFET N-well prior to gate oxide formation according to the present invention.

FIG. 10 is a dual plot of inverter delay and inverter leakage versus PFET gate tunneling leakage current with a nitrogen ion implantation of the PFET N-well prior to gate oxide formation according to the present invention. Inverter leakage is the sum of both the PFET and the NFET gate tunneling leakages and sub-threshold voltage leakage. In FIG. 10, the inverter delay the PFET gate tunneling current leakage current and inverter leakage current are plotted on linear scales. In FIG. 10, a region 450 is indicated where no nitrogen ion implantation has been performed into the N-wells of the PFETs. A region 455 is indicated where a nitrogen ion implantation has been performed into the N-wells of the PFETs but is defined as an excess nitrogen implantation region because of the very small changes in inverter delay curve 460 in region 455. A region 465 between regions 450 and 455 is indicated. In region 460, significant decreases in inverter delay are realized as a function of nitrogen ion implantation. Inverter delay line 470 is approximately linear.

If delay curve 460 and leakage 470 are considered to be based on a NFET having a "nominal" gate oxide thickness, then both inverter delay curve 460 and inverter leakage line 470 will move based as the NFET gate oxide thickness is made thinner or thicker than nominal. This enhances the usefulness of the present invention as both the ion implantation dose as well as the nominal gate oxide thickness of the oxidation process can be tuned to give desired performance improvements at the lowest cost in increased gate tunneling leakage. With a nitrogen ion implantation into the N-wells of PFETs and a single simultaneous gate oxidation process for both NFETs and PFETs, the gate oxide thickness of the NFETs is a function of the gate oxidation process and the gate oxide thickness of the PFETs is a function of the gate oxidation process and the nitrogen ion implantation dose.

Figure 11:
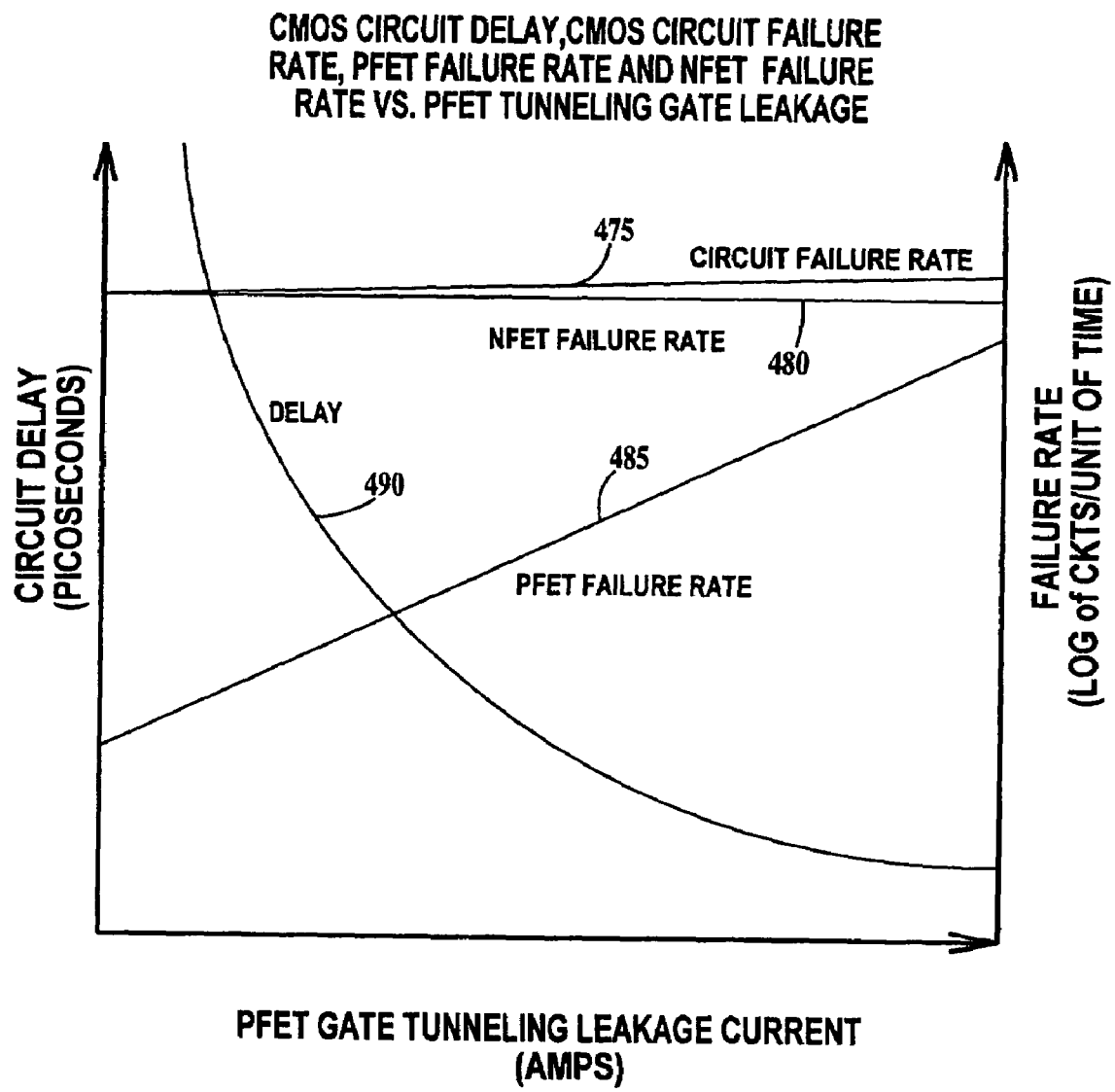
FIG. 11 is a dual plot of CMOS circuit delay, CMOS circuit failure rate, NFET failure rate and PFET failure rate versus PFET gate tunneling leakage current with a nitrogen ion implantation of the PFET N-well prior to gate oxide formation according to the present invention.

FIG. 11 is a dual plot of CMOS circuit delay, CMOS circuit failure rate, NFET failure rate and PFET failure rate versus PFET gate tunneling leakage current with a nitrogen ion implantation of the PFET N-well prior to gate oxide formation according to the present invention. FIG. 11 plots only the failure rates caused by gate oxide failures. In FIG. 11, the failure rate (circuits failing per unit of time) of an arbitrary CMOS circuit is indicated by a line 475, the NFET failure rate of NFETs of the arbitrary CMOS circuit is indicated by line a 480, the PFET failure rate of PFETs in the arbitrary CMOS circuit is indicated by a line 485 and the delay through the arbitrary CMOS circuit is indicated by curve 490. The similarity of FIG. 11 to FIG. 10 should be noted. FIG. 11 indicates the CMOS circuit failure rate shows a negligible increase as the PFET failure rate and the PFET gate tunneling leakage increase (in response to decreases PFET gate oxide thickness), but the CMOS circuit delay decreases significantly. It should be noted, that FIG. 11 also indicates that when NFET gate oxide thickness is the controlling parameter for CMOS circuit failure rates, thickening the NFET gate oxide thickness by a fluorine on implantation into the P-wells of NFETs will decrease the CMOS failure rate without increasing the PFET failure rate.

Figure 12A:
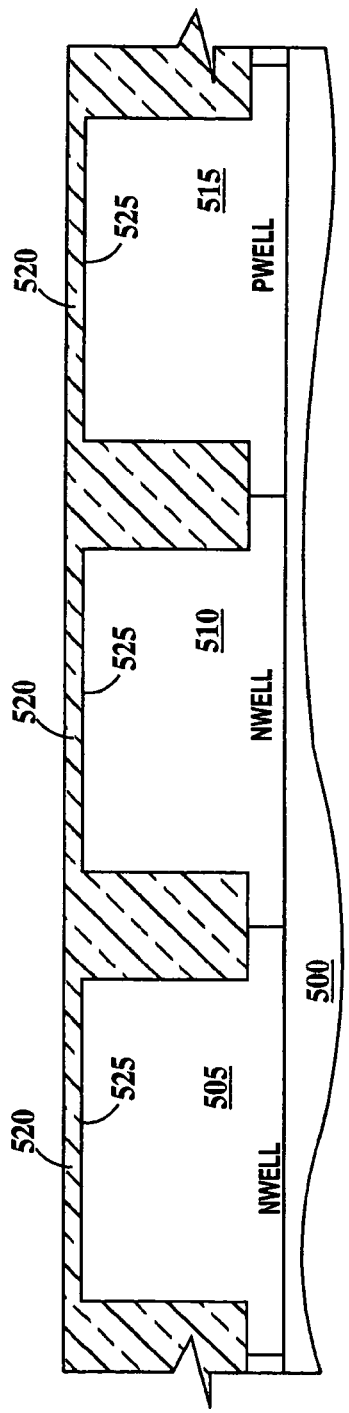
Figure 12B:
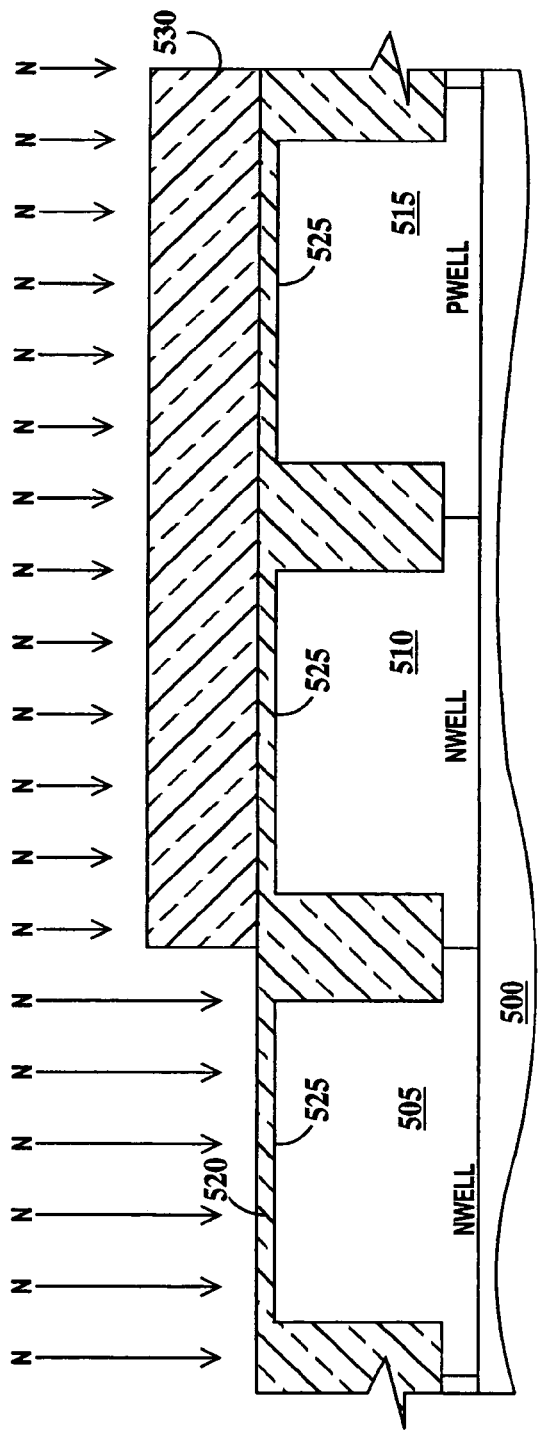

FIGS. 12A through 12D are partial cross-sectional views illustrating how multiple different gate oxide thickness regions can be fabricated according to a third embodiment of the present invention. In FIG. 12 a first N-well 505, a second N-well 510 and a P-well 515 are formed in a substrate 500 and a screen oxide 520 formed on a surface 525 of the substrate. In FIG. 12B a masking layer 530 is formed over second N-well 510 and P-well 515 and a nitrogen ion implantation performed. The nitrogen ion implantation penetrates into first N-well 505, but not second N-well 510 or P-well 515. In FIG. 12C, masking layer 530 of FIG. 12B has been removed and a second masking layer 535 formed over P-well 515 and a second nitrogen ion implantation performed. The second nitrogen ion implantation penetrates both first and second N-wells 505 and 510 but not P-well 515. In FIG. 12D, screen oxide 520 of FIG. 12C has been removed and a gate oxidation performed to create a gate oxide layer 540. Gate oxide layer 540 has a physical thickness T7 over first N-well 505, a physical thickness T8 over second N-well 510 and a physical thickness T9 over P-well 515 where T9 is greater than T8 and T8 is greater than T7.

Thus, PFETs fabricated in first and second N-wells 505 and 510 will both be thin gate PFETs and an NFET fabricated in P-well 515 will be a reference NFET by the definitions given supra. However, the PFET is first N-well 505 will have a thinner gate oxide, a higher gate tunneling leakage current and a faster switching speed than the PFET formed in second N-well 510.

Various variations of this process may be employed, such using a first mask that exposes only first N-well 505 to a first nitrogen ion implantation and a second mask that only exposes second N-well 510 to a second nitrogen ion implantation. The number of mask/ion implantations may be extended to any number and similar schemes using fluorine ion implantation into P-wells may be subsituted. The different thicknesses of gate oxide may not only be incorporated into PFETs and NFETS, but used for other devices such as capacitors.

Thus the present invention provides integrated circuits that have higher performance without significant increases in power consumption.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, not all PFETs (NFETs) in a given integrated circuit or in a given integrated circuit chip need be treated with an ion implantation step. Also many other circuit types besides inverters and ring oscillators can be fabricated using the present invention, for example logic gates. Therefore, it is intended that the following claims cover all such modifications and changes as fall within the true spirit and scope of the invention.

What is claimed is:

1. A method of fabricating semiconductor devices, comprising:

(a) providing an N-well and a P-well in a substrate;

selecting a first thickness of a first thermal gate oxide layer to be formed over said P-well and selecting a second thickness of a second thermal gate oxide layer to be formed over said N-well, said first and second thicknesses selected so a first gate tunneling leakage current of said first thermal gate oxide layer is less than about 3 times a second gate tunneling leakage current of said second thermal gate oxide layer;

selecting one or more ion implantation doses and species combinations based on a relationship between ion implantation species and ion implantation species dose and a first thermal oxide growth rate and a second thermal oxide growth rate;

ion implanting either said N-well, said P-well or both said N-well and said P-well using said selected one or more ion implantation and species combinations; and simultaneously growing said first thermal gate oxide layer at said first rate on a surface of said substrate over said P-well and growing said second thermal gate oxide layer at said second rate on said surface of said substrate over said N-well, said first rate different than said second rate.

2. The method of claim 1, wherein said implanting implants nitrogen or fluorine.

3. The method of claim 1, wherein said implanting implants into said N-well and said first rate is greater than said second rate.

4. The method of claim 1, wherein said implanting implants nitrogen into said N-well and said first rate is greater than said second rate.

5. The method of claim 1, wherein said implanting implants into said P-well and said second rate is greater than said first rate.

6. The method of claim 1, wherein said implanting implants nitrogen into said P-well and said second rate is greater than said first rate.

7. The method of claim 1, wherein said implanting implants into said P-well and said first rate is greater than said second rate.

8. The method of claim 1, wherein said implanting implants fluorine into said P-well and said first rate is greater than said second rate.

9. The method of claim 1, wherein said implanting implants into said N-well and said second rate is greater than said first rate.

10. The method of claim 1, wherein said implanting implants fluorine into said N-well and said second rate is greater than said first rate.

11. The method of claim 1, further including:

forming a first gate on a top surface of said first thermal gate oxide layer and forming a second gate on a top surface of said second thermal gate oxide layer;

(e) forming N doped source/drains on opposite sides of said first gate in said P-well; and forming P doped source/drains on opposite sides of said second gate in said N-well.

12. The method of claim 1, further including:

forming a gate dielectric layer on atop surface of said first and said second thermal gate oxide layers;

forming a first gate on a top surface of said gate dielectric layer over said first thermal gate oxide layer and forming a second gate on said top surface of said gate dielectric layer over said second thermal gate oxide layer;

forming N doped source/drains on opposite sides of said first gate in said P-well; and forming P doped source/drains on opposite sides of said second gate in said N-well.

13. The method of claim 1, wherein a thickness of said first thermal gate oxide layer is different than a thickness of said second thermal gate oxide layer.

14. The method of claim 1, wherein a thickness of said first thermal gate oxide layer is greater than a thickness of said second thermal gate oxide layer.

15. A method of fabricating an inverter comprising:

providing a P-well and an N-well in a substrate;

selecting a first thickness of a first thermal gate oxide layer to be formed over said P-well and selecting a second thickness of a second thermal gate oxide layer to be formed over said N-well, and first and second thicknesses selected so a first gate tunneling leakage current of said first thermal gate oxide layer less than about 3 times a second gate tunneling leakage current of said second thermal gate oxide layer;

selecting one or more ion implantation doses and species combinations based on a relationship between ion implantation species and ion implantation species dose and a first thermal oxide growth rate and a second thermal oxide growth rate;

ion implanting said N-well with nitrogen;

simultaneously growing said first thermal gate oxide layer at said first rate on said surface of said substrate over said P-well and growing said second thermal gate oxide layer at said second rate on said surface of said substrate over said N-well, said first rate different than said second rate;

forming a first gate on a top surface of said first thermal gate oxide layer and forming a second gate on a top surface of said second thermal gate oxide layer;

forming an N doped source and an N doped drain on opposite sides of said first gate in said P-well, said N-doped source, N-doped drain, said first gate and said N-well defining a NFET;

forming a P doped source and a P doped drain on opposite sides of said second gate in said N-well, said P-doped source, P-doped drain, said second gate and said P-well defining a PFET; and coupling said P doped source to VDD, coupling said N doped source to ground, coupling said N doped and P doped drains to an output and coupling said first and second gates to an input.

16. The method of claim 15, wherein said first rate is greater than said second rate.

17. The method of claim 15, wherein a thickness of said first thermal gate oxide layer is greater than a thickness of said second thermal gate oxide layer.

18. The method of claim 15, wherein said selecting said first and second thickness and said selecting said one or more ion implanted does are selected so a gate tunneling leakage current of said PFET is about equal to a gate tunneling leakage current of said NFET.

19. The circuit of claim 15, wherein said selecting said first and second thickness and said selecting said one or more ion implanted does are selected so a switching speed of said PFET is about equal to the switching speed of said NFET.

20. The semiconductor circuit of claim 15, wherein said selecting said first and second thickness and said selecting said one or more ion implanted does are selected so a gate dielectric failure rate of said PFET is about equal to a gate dielectric failure rate of said NFET.

21. The method of claim 15, further including:
forming a dielectric isolation between said N-well and said P-well.

22. The method of claim 1, wherein said selecting said first and second thickness and said selecting said one or more ion implanted does are selected so said gate tunneling leakage current of said second thermal gate oxide layer about equal to said gate tunneling leakage current of said second thermal gate oxide layer.

23. The method of claim 1, further including forming a first gate electrode in direct physical contact with said first gate oxide layer and forming a second gate electrode in direct physical contact with said second gate oxide layer.

* * * * *

UNITED STATES PATENT AND TRADEMARK OFFICE
CERTIFICATE OF CORRECTION

PATENT NO. : 7,087,470 B2 Page 1 of 1
APPLICATION NO. : 10/873012
DATED : August 8, 2006
INVENTOR(S) : Anderson et al.

It is certified that error appears in the above-identified patent and that said Letters Patent is hereby corrected as shown below:

Column 8
Line 39, delete "such" and insert -- such as --

Column 10
Lines 58 and 63, delete "does" and insert -- doses --

Column 11
Lines 1 and 9, delete "does" and insert -- doses --

Signed and Sealed this

Fifth Day of December, 2006

JON W. DUDAS
*Director of the United States Patent and Trademark Office*